(12) United States Patent
Chamaly et al.

(10) Patent No.: US 9,391,589 B2
(45) Date of Patent: Jul. 12, 2016

(54) SURFACE ACOUSTIC WAVE FILTER ON A LITHIUM NIOBATE SUBSTRATE

(75) Inventors: Stephane Chamaly, Singapore (SG); Hoi Yan Anna Fong, Singapore (SG)

(73) Assignee: EPCOS AG, Munich (DE)

( * ) Notice: Subject to any disclaimer, the term of this patent is extended or adjusted under 35 U.S.C. 154(b) by 255 days.

(21) Appl. No.: 13/981,552

(22) PCT Filed: Jan. 24, 2011

(86) PCT No.: PCT/EP2011/050897
§ 371 (c)(1),
(2), (4) Date: Oct. 4, 2013

(87) PCT Pub. No.: WO2012/100813
PCT Pub. Date: Aug. 2, 2012

(65) Prior Publication Data
US 2014/0028414 A1    Jan. 30, 2014

(51) Int. Cl.
*H03H 9/64* (2006.01)
*H03H 9/02* (2006.01)

(52) U.S. Cl.
CPC ............. *H03H 9/64* (2013.01); *H03H 9/02559* (2013.01); *H03H 9/02755* (2013.01); *H03H 9/02834* (2013.01); *H03H 9/6433* (2013.01); *H03H 9/6463* (2013.01)

(58) Field of Classification Search
CPC ............. H03H 9/009; H03H 9/02543; H03H 9/02559; H03H 9/02755; H03H 9/02779; H03H 9/64; H03H 9/6433; H03H 9/6463; H03H 9/6483; H03H 9/02834; H03H 9/0274; H03H 9/6436; H03H 9/6456

USPC .............................. 333/193, 195; 310/313 A
See application file for complete search history.

(56) References Cited

U.S. PATENT DOCUMENTS

| | | | | |
|---|---|---|---|---|
| 4,544,857 | A * | 10/1985 | Shimizu et al. | 310/313 B |
| 4,785,270 | A * | 11/1988 | Kinsman | 333/193 |
| 5,204,575 | A | 4/1993 | Kanda et al. | |
| 5,682,126 | A * | 10/1997 | Plesski et al. | 333/193 |
| 5,729,186 | A | 3/1998 | Seki et al. | |
| 6,661,313 | B2 | 12/2003 | Naumenko et al. | |
| 6,677,696 | B1 | 1/2004 | Ruile | |
| 6,903,488 | B2 * | 6/2005 | Nakano et al. | 310/313 A |
| 7,046,102 | B2 * | 5/2006 | Nakamura et al. | 333/133 |
| 7,102,468 | B2 * | 9/2006 | Otsuka et al. | 333/195 |

(Continued)

FOREIGN PATENT DOCUMENTS

| CN | 1134627 A | 10/1996 |
|---|---|---|
| CN | 1521946 A | 8/2004 |

(Continued)

OTHER PUBLICATIONS

Hashimoto, K., et al., "Wideband Love Wave Filters Operating in GHz Range on Cu-Grating/Rotated-YX-LiNbO3-Substrate Structure," IEEE Ultrasonics Symposium, vol. 2, 2004, pp. 1330-1334.

(Continued)

*Primary Examiner* — Barbara Summons
(74) *Attorney, Agent, or Firm* — Slater Matsil, LLP

(57) ABSTRACT

A surface acoustic wave filter includes a θ-rotated Y-cut X-propagation lithium niobate substrate. The cut angle ranges from 20° to 40°. An interdigital transducer can be used for exciting a surface acoustic wave that is formed on the substrate.

12 Claims, 9 Drawing Sheets

(56) References Cited

U.S. PATENT DOCUMENTS

| | | | |
|---|---|---|---|
| 7,298,231 B2 * | 11/2007 | Ikuta et al. | 333/133 |
| 7,336,016 B2 | 2/2008 | Oshio | |
| 7,446,453 B1 * | 11/2008 | Naumenko et al. | 310/313 A |
| 7,569,972 B2 | 8/2009 | Nishiyama et al. | |
| 2001/0013815 A1 | 8/2001 | Sawada | |
| 2002/0140316 A1 * | 10/2002 | Yamanouchi | 310/313 A |
| 2007/0096592 A1 * | 5/2007 | Kadota et al. | 310/313 A |
| 2007/0109075 A1 * | 5/2007 | Igaki | 333/195 |
| 2007/0120439 A1 | 5/2007 | Kadota et al. | |
| 2008/0129418 A1 * | 6/2008 | Miura et al. | 333/195 |
| 2008/0315973 A1 * | 12/2008 | Nakamura et al. | 333/196 |
| 2009/0096320 A1 | 4/2009 | Yaoi et al. | |
| 2009/0116340 A1 * | 5/2009 | Tanaka et al. | 367/137 |
| 2010/0164646 A1 * | 7/2010 | Nakanishi et al. | 333/133 |
| 2010/0219905 A1 * | 9/2010 | Nakamura et al. | 333/133 |
| 2011/0199168 A1 * | 8/2011 | Kadota | 333/195 |

FOREIGN PATENT DOCUMENTS

| | | |
|---|---|---|
| CN | 1585266 A | 2/2005 |
| CN | 101421922 A | 4/2009 |
| EP | 2012428 A1 | 1/2009 |
| JP | 1188100 A | 3/1999 |
| JP | 2001308672 A | 11/2001 |
| JP | 2002033642 A | 1/2002 |
| WO | 9935738 A1 | 7/1999 |
| WO | 2006011417 A1 | 2/2006 |
| WO | WO 2010/058570 * | 5/2010 |

OTHER PUBLICATIONS

Hashimoto, K., et al., "A Wideband Multi-Mode SAW Filter Employing Pitch Modulated IDTs on Cu-Grating/15°YX-LiNbO3-Substrate Structure," Proceedings of the IEEE International Ultrasonics Symposium, 2009, pp. 915-918.

Hashimoto, K., et al., "A Wideband Multi-Mode SAW Filter Employing Pitch Modulated IDTs on Cu-Grating/15°YX-LiNbO3-Substrate Structure," IEEE Transactions on Ultrasonics, Ferroelectrics, and Frequency Control, vol. 57, No. 5, May 2010, pp. 1183-1187.

Isobe, A., et al., "Grating-Mode-Type Wide-Band SAW Resonators for VCOs," IEEE Ultrasonics Symposium, 1998, pp. 111-114.

Koskela, J., et al., "Suppression of the Leaky SAW Attenuation with Heavy Mechanical Loading," IEEE Transactions on Ultrasonics, Ferroelectrics, and Frequency Control, vol. 45, No. 2, Mar. 1998, pp. 439-449.

Omori, T., et al., "Suppression of Transverse Mode Responses for Ultra-wideband and Low-Loss SAW Filters on a Cu-grating/15°YX-LiNbO3 Structure," IEEE Ultrasonics Symposium, 2005, pp. 1056-1060.

Shimizu, H., et al., "Love-Type-SAW Resonator of Small Size with Very Low Capacitance Ratio and its Application to VCO," IEEE Ultrasonics Symposium, 1990, pp. 103-108.

Montgomery, C.G., et al., "Principles of Microwave Circuits," London, U.K: Peter Peregrinus on behalf of the Institution of Electrical Engineers, 1987, Print, Chapter 5, pp. 130-161.

Montgomery, C.G., et al., "Principles of Microwave Circuits," London, U.K: Peter Peregrinus on behalf of the Institution of Electrical Engineers, 1987, Print, Chapter 7, pp. 207-239.

* cited by examiner

- Prior art -

SURFACE ACOUSTIC WAVE FILTER ON A LITHIUM NIOBATE SUBSTRATE

This patent application is a national phase filing under section 371 of PCT/EP2011/050897, filed Jan. 24, 2011, which is incorporated herein by reference in its entirety.

TECHNICAL FIELD

The present invention concerns a surface acoustic wave (SAW) filter that can excite a surface acoustic wave on a substrate of piezoelectric material and selectively extract a desired frequency band.

BACKGROUND

SAW filters can be used in high-frequency circuits, e.g., in a bandpass filter. A SAW filter comprises a piezoelectric material and an electrode structure. The electrodes can transform a high-frequency signal into an acoustic wave which propagates along the surface of the piezoelectric material. Further, a second electrode structure is arranged to transform the acoustic wave back into a high-frequency signal thereby selectively extracting a desired frequency band.

SAW filters can be used as part of a front-end module of a mobile phone. There is a need to reduce the overall cost and to simplify the design. Accordingly, SAW filters without a matching network are requested.

U.S. Pat. No. 5,729,186 discloses a SAW filter that comprises thin aluminum electrodes on a lithium niobate substrate with a cut angle of 41°. This filter achieves a relative bandwidth of 9%. Further, SAW filters comprising a lithium niobate substrate with cut angles of 64° are known. These filters have a lower loss than the filters disclosed by U.S. Pat. No. 5,729,186 but with the drawback of a smaller achievable bandwidth.

SUMMARY OF THE INVENTION

In one aspect, the present invention provides an SAW filter that provides a larger bandwidth and that does not need a matching network.

The present invention provides an SAW filter comprising a $\theta$-rotated y-cut x-propagation lithium niobate substrate wherein the cut angle $\theta$ ranges from 20° to 40°. The SAW filter further comprises an interdigital transducer for exciting a surface acoustic wave that is formed on the substrate.

Here, the Euler angles $\alpha$, $\beta$ and $\gamma$ are defined as follows: x, y, z are the crystallographic axis of the substrate. At first, a rotation of the plane spanned between the x-axis and the y-axis around the z-axis is performed wherein the x-axis is rotated into the direction of the y-axis. The first Euler angle $\alpha$ is the angle of this rotation. The rotation provides a new set of axes x', y', z' wherein z' equals the original axis z.

In a second rotation, the plane between the z'-axis and the y'-axis is rotated around the x'-axis. Here, the y'-axis is rotated in the direction of the z'-axis. The angle $\beta$ of this rotation represents the second Euler angle. This second rotation provides a new set of axis x", y", z" wherein x' equals x".

In a third rotation, the x"-axis and the y"-axis are rotated around the z"-axis wherein the x"-axis is rotated in the direction of the y"-axis. The angle $\gamma$ of this rotation represents the third Euler angle. This third rotation provides again a new set of axes x''', y''', z''' wherein z" equals z'''.

The transformation as described here provides an x'''-axis and an y'''-axis that are parallel to the surface of the substrate. Further, the z'''-axis is normal to the surface of the substrate. The x'''-axis is parallel to the propagation direction of the acoustic waves.

This definition is in accordance with the international standard IEC 62276, 2005-05, Annex A1.

However, instead of using the Euler angles $\alpha$, $\beta$ and $\gamma$, the cut angles of the lithium niobate substrate can be defined by the angles $\alpha$, $\theta$ and $\gamma$ wherein the angle $\beta$ equals 0-90°.

The inventors have found that choosing the cut angle $\theta$ in a range from 20° to 40° provides an SAW filter with a large relative bandwidth of about 12%.

The SAW filter is constructed to maximize the coupling which is directly linked to the relative bandwidth, to maximize the reflection coefficient and to minimize the propagation loss. However, these objects contradict each other and cannot be reached at the same time by a single embodiment so that a good trade off needs to be found that provides a SAW filter with sufficiently high coupling, sufficiently high reflection coefficient and sufficiently low propagation loss. Definitions of coupling and reflection coefficient are given later. The propagation loss describes the amount of the signal that gets lost when the signal propagates through the filter.

The coupling, the reflection coefficient and the propagation loss of an SAW filter can be influenced, for example, by respectively choosing a cut angle range, a metallization ratio and a relative metallization thickness. The definitions of metallization ratio and relative metallization thickness are also given later.

In one embodiment, the interdigital transducer is made of films of a metal selected from the group consisting of aluminum and an aluminum alloy.

In one embodiment, the SAW filter comprises a resonator formed by a respective metallization structure on the substrate. The resonator can also be made of films of a metal selected from the group consisting of aluminum and an aluminum alloy.

An interdigital transducer comprises two comb-shaped electrodes engaging each other which are placed on the piezoelectric substrate. In one embodiment, the electrode thickness h is given by $h \leq \lambda*(\theta/6°+0.5)/100$.

Here, $\lambda$ is the wavelength of the excited SAW and $\theta$ is the cut angle of the substrate.

In one embodiment, the metallization ratio $\eta$ ranges from 0.3 to 0.55 wherein w is a width of an electrode finger of the interdigital transducer and g is a gap width of the electrode fingers of a transducer with a normal finger arrangement that the equation $\eta=w/(g+w)$ holds true.

The electrode geometry is defined by the electrode thickness and the metallization ratio. The range given for these two electrode geometry parameters and for the substrate cut angle provides a good tradeoff between insertion loss and maximum reachable bandwidth of the filter.

In one embodiment, the SAW filter excites a leaky-wave. Due to the low metal thickness, the wave propagates with losses.

In one embodiment, the filter comprises two acoustic tracks arranged in a cascade. Each acoustic track can be composed of multiple interdigital transducers with acoustic cavities in-between different transducers. The acoustic cavities can be "filled" by metalized stripes that are not part of the transducers. A metalized stripe at the surface of the substrate prevents the surface wave from entering into the substrate. Further, the metallization helps to adjust the velocity of the wave in the areas that are not covered by an IDT to the velocity in the areas covered by an IDT.

Alternatively, acoustic cavities can be filled by electrodes belonging to a side IDT with a pitch different from the remaining of the IDT.

In one embodiment, the SAW filter and its metallization structures are covered by a temperature compensation layer and/or a protection layer. This temperature compensation layer helps to reduce the temperature dependency of the resonance frequency of the SAW filter. An $SiO_2$ layer can be chosen as temperature compensation layer and placed on the filter as $SiO_2$ has an opposite temperature dependency compared to the piezoelectric material. A protection layer can serve to protect the electrodes from corrosion or from shorting due to metallic particles which may be present in the package.

In one embodiment, the interdigital transducers can be electrically circuited in a ladder-type arrangement or in a balanced bridge arrangement. Alternatively, the interdigital transducers can be acoustically coupled. Examples of acoustic coupling are DMS (Double Mode Symmetric) structures and IIDT (Interdigitated Interdigital Transducer) structures. In both structures, input transducers and output transducers are placed alternating on the acoustic track and are coupled acoustically to each other. Further, reflecting structures can be placed at both ends of the acoustic track in a DMS structure. Furthermore, combinations of electrical and magnetic coupling are possible as well.

In one embodiment, the other cut angles α and γ range from −5° to +5°. Preferably, they are 0°.

BRIEF DESCRIPTION OF THE DRAWINGS

The present invention will become fully understood from the detailed description given hereinbelow and the accompanying schematic drawings. In the drawings.

DETAILED DESCRIPTION OF ILLUSTRATIVE EMBODIMENTS

Figure 1:
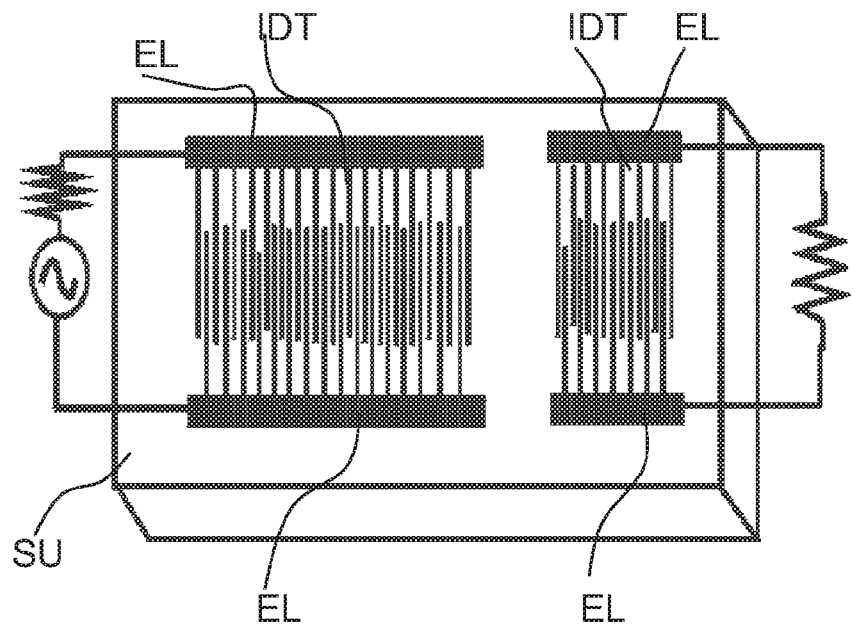
FIG. 1 shows an SAW filter.
Figure 2:
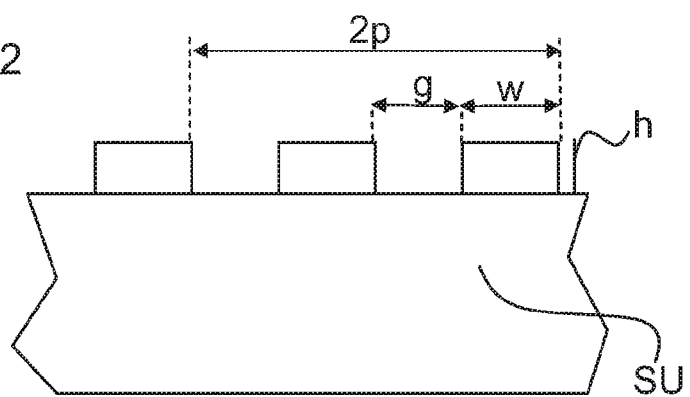
FIG. 2 shows the cross-section of a SAW filter.

FIG. 1 is a schematic view showing a surface acoustic wave filter according to the present invention. FIG. 2 is a portion of a cross-sectional view of the SAW filter.

The SAW filter comprises a piezoelectric substrate SU. The substrate SU is lithium niobate. Further, two interdigital transducers IDT are placed on the substrate SU. The first transducer IDT transforms a high-frequency signal applied to its electrodes into a surface acoustic wave. The second transducer IDT transforms the surface acoustic wave back to a high-frequency signal thereby selectively extracting a desired frequency band.

Each transducer IDT comprises two electrodes EL wherein the fingers of the electrodes overlap each other on an acoustic track. The width of a finger is given by w. The gap width between two fingers is given by g. Further, the thickness of a finger is given by h. An SAW filter as shown in FIGS. 1 and 2 excites a surface acoustic wave with a wavelength λ. In a normal finger arrangement like shown the wavelength λ equals twice the period p of the interdigital transducer. The period p is given by the sum of a finger width w and a gap width g. The period p may vary along the IDT.

A SAW resonator is composed of a single IDT with an additional array of shorted electrodes on each side as reflectors.

Figure 3:
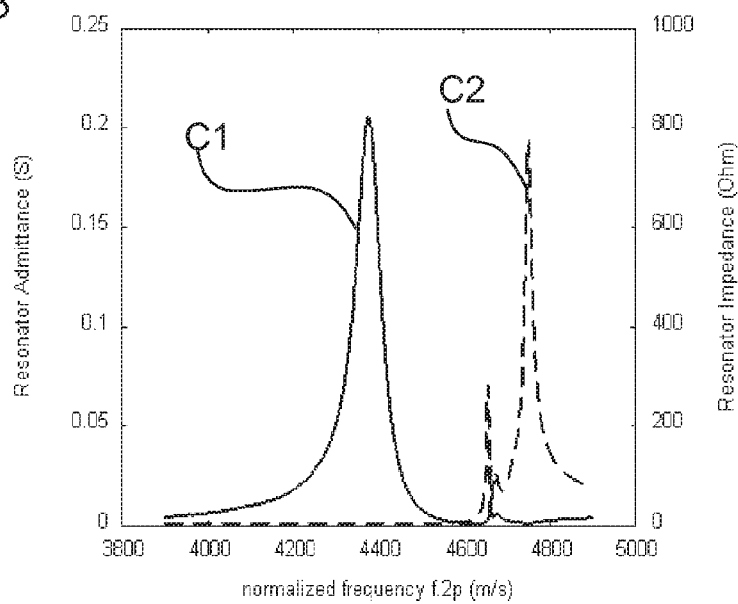
FIG. 3 shows the admittance and impedance of a SAW filter on a substrate with a cut angle of 40° and a metallization ratio η of 0.4.

FIG. 3 shows the admittance and the impedance for a SAW resonator with a constant pitch. On the axis of abscissae, the normalized frequency is shown. The frequency is multiplied with twice the period p. Curve C1 shows the impedance and curve C2 shows the admittance.

In the following a normalized frequency is considered wherein the frequency is normalized by multiplication of the wavelength of the excited SAW. Thereby, an SAW filter can be determined that provides a good performance independently of the used frequency spectrum. The propagation parameters extracted using this method can be used to model the behavior of electrodes of any geometry. Further an IDT can be modeled. Even an IDT with a non-constant pitch can be modeled by combination of individual electrodes.

The admittance has two peaks. The first peak gives the resonance frequency $f_R$ of the SAW filter. A smaller second resonance occurs at the frequency $f_E$. This second resonance is due to the finite length of the resonator. The second resonance frequency $f_E$ denotes the end of the stopband of the filter. The impedance has one peak at the anti-resonance frequency $f_A$ of the SAW filter.

The stopband ranges from $f_R$ to $f_E$. The center of the stopband is given by $f0=(f_R-f_E)/2$. The coupling and the reflection coefficient can be calculated from these frequencies. The coupling is defined as $$2\Delta v/v=2(f_A-f_R)/f_0$$

and the reflection coefficient R per electrode is defined as $$R = \pi/2 * (f_E - f_R)/f_0.$$

The definition of propagation loss will be discussed in the following.

The quality factor Q of the resonator is computed from the definition.

$$Q_Z = \frac{f}{2R} \cdot \frac{\partial X}{\partial f}$$

$$Q_Y = \frac{f}{2F} \cdot \frac{\partial B}{\partial f}$$

Where Y=B+jG is the admittance and Z=1/Y=R+jX is the impedance. Admittance and impedance can be determined from measurement or from harmonic admittance computation.

QZ provides a good evaluation of the Q in the vicinity of the resonance.

QY provides a good evaluation of the Q in the vicinity of the anti-resonance.

A frequency varying quality factor is then constructed from QZ and QY.

$$Q = \begin{cases} Q_Z \forall f < \frac{f_R + f_A}{2} \\ Q_Y \forall f \geq \frac{f_R + f_A}{2} \end{cases}$$

This approach is effective because of the high coupling coefficient, i.e., the large distance between $f_R$ and $f_A$ that can be found in materials used for large filter bandwidth. Of course, a small discontinuity may appear at the junction but it is not a problem for the principle of this approach.

Propagation loss referenced to the period is then computed from Q $$\alpha = \frac{20 \cdot \text{Log}_{10}(e)}{Q} \text{ in } db/2p$$

The maximum loss is defined as the maximum losses in the span ranging from resonance frequency to anti-resonance frequency.

FIGS. 4 to 17 show the results of measurements and simulations of the SAW filter. The following values are considered: maximum propagation loss, coupling, and reflection coefficient. These parameters are considered as functions of a metallization ratio η and a relative metal thickness h/2p. The metallization ratio η can be calculated as w/(g+w). The relative thickness of an electrode is given by the absolute thickness divided by the wavelength of the excited surface acoustic wave. By dividing the thickness h through the wavelength, the considerations are independent of a specific frequency range, thereby providing an SAW filter that is applicable for different frequency ranges.

Maximum propagation loss, coupling and reflection coefficients are considered for different cut angles θ ranging from 20° to 40°.

Figure 4:
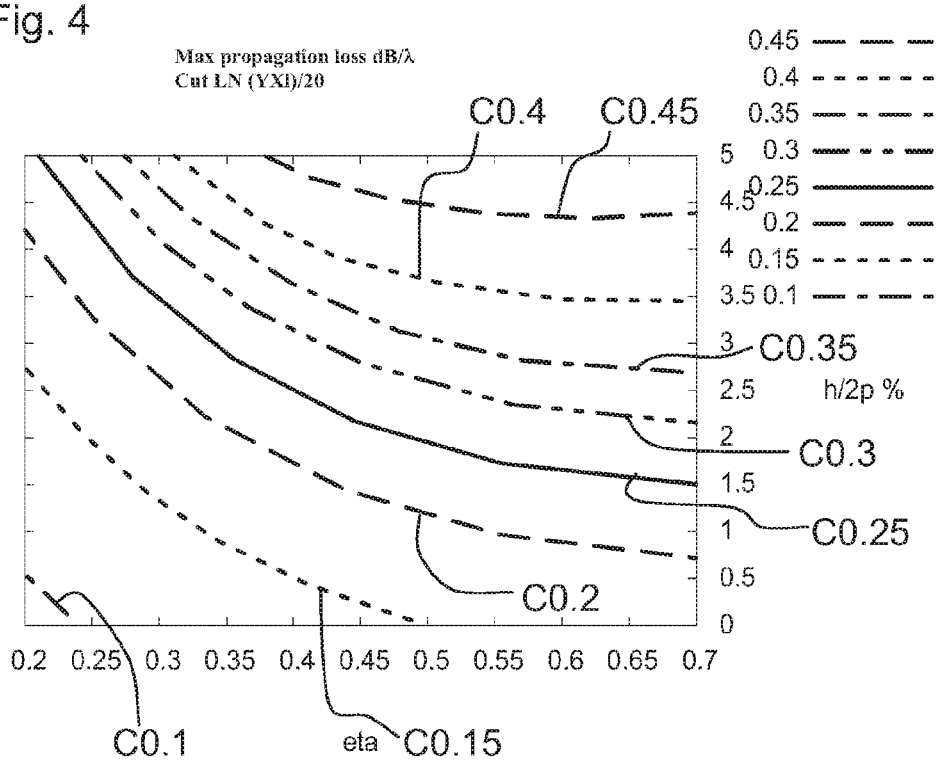
FIG. 4 shows the maximum propagation loss as a function of the metallization ratio and the relative metal thickness for a cut angle of 20°.

FIG. 4 shows the maximum propagation loss as a function of a metallization ratio η and a relative metal thickness h/2p. The metallization ratio η is shown on the axis of abscissae and the relative metal thickness h/2p is shown on the axis of ordinates. Furthermore, the maximum propagation loss as shown in FIG. 4 is normalized by a division through the wavelength of the excited SAW. The cut angle θ is 20° here.

Curve C0.1 describes the values of the metallization ratio η and of the relative metal thickness h/2p that provide a maximum propagation loss of 0.1 dB/X. Further, curve C0.15 describes the values of the metallization ratio η and of the relative metal thickness h/2p that provide a maximum propagation loss of 0.15 dB/λ. Analog, curves C0.2, C0.25, C0.3, C0.35, C0.4 and C0.45 describe the metallization ratio η and the relative metal thickness h/2p that provide a maximum propagation loss of 0.2 dB/λ, 0.25 dB/λ, 0.3 dB/λ, 0.35 dB/λ, 0.4 dB/λ or 0.45 dB/λ respectively.

It can be gathered from the FIG. 4 that an increase in the metallization ratio η requires a decrease in the relative metal thickness h/2p in order to maintain a constant maximum propagation loss.

Figure 7:
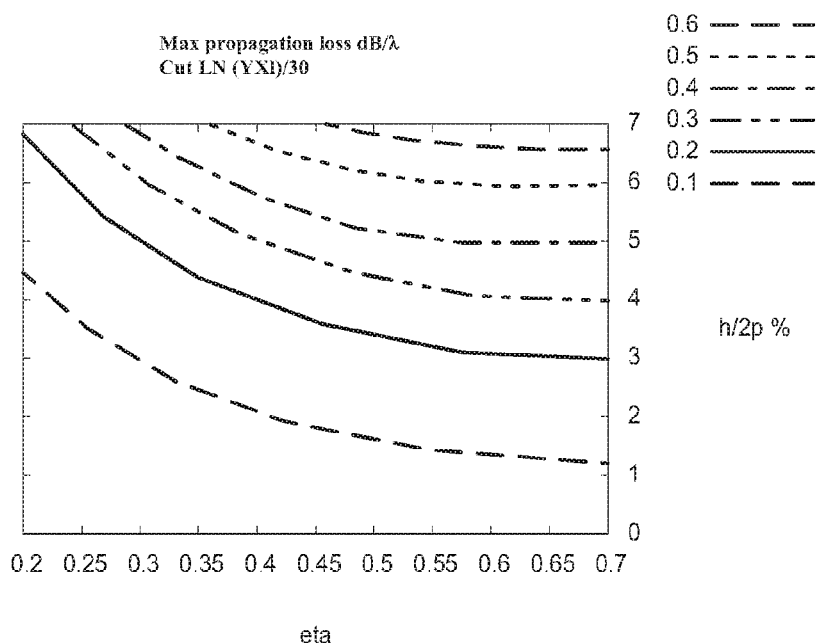
FIG. 7 shows the maximum propagation loss as a function of the metallization ratio and the relative metal thickness for a cut angle of 30°.
Figure 10:
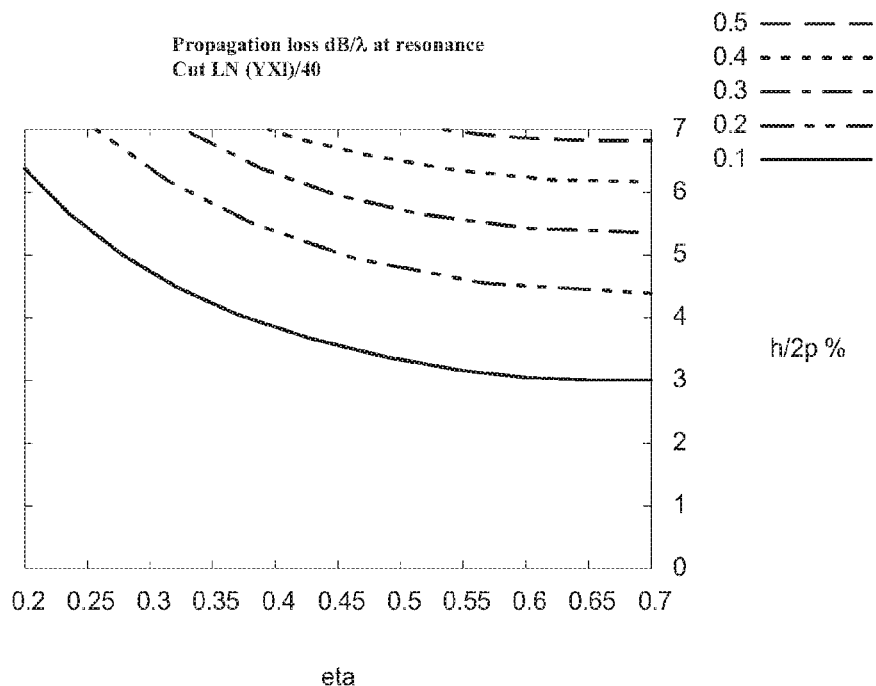
FIG. 10 shows the maximum propagation loss as a function of the metallization ratio and the relative metal thickness for a cut angle of 40°

Moreover, FIGS. 7 and 10 also show the maximum propagation loss as a function of a metallization ratio η and a relative metal thickness h/2p. In these figures other cut angles θ are chosen. In FIG. 7 the cut angle θ is 30°. Further, the cut angle θ is 40° in FIG. 10.

It can be gathered from the figures that for a given relative metal thickness h/2p the maximum propagation loss decreases with a decreasing metallization ratio η.

Figure 5:
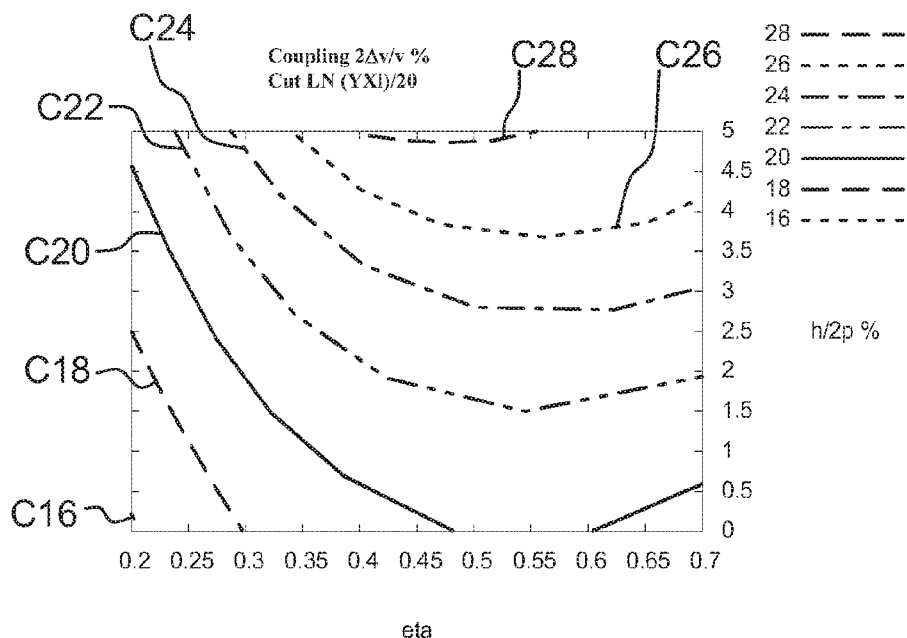
FIG. 5 shows the coupling as a function of the metallization ratio and the relative metal thickness for a cut angle of 20°.
Figure 8:
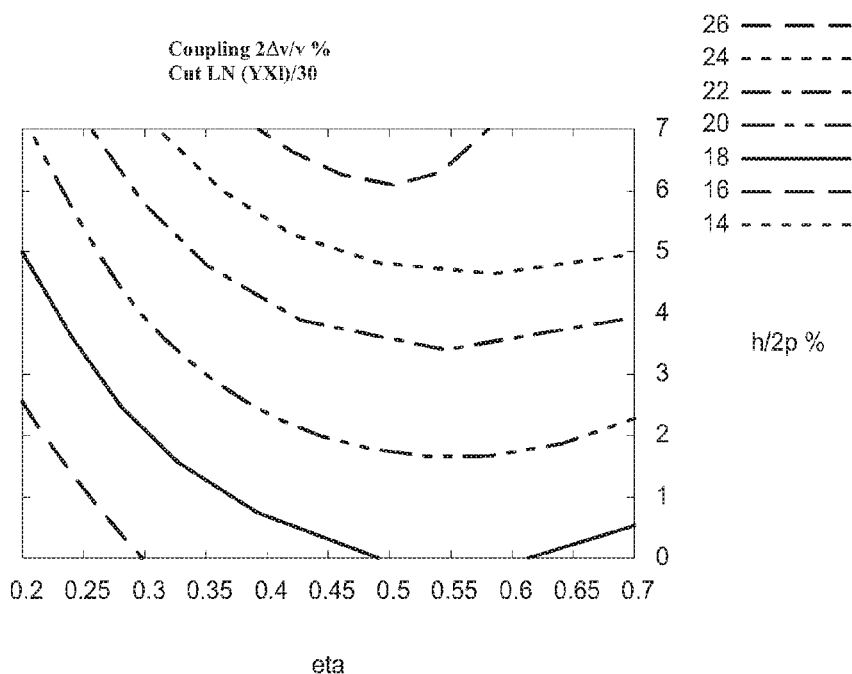
FIG. 8 shows the coupling as a function of the metallization ratio and the relative metal thickness for a cut angle of 30°.
Figure 11:
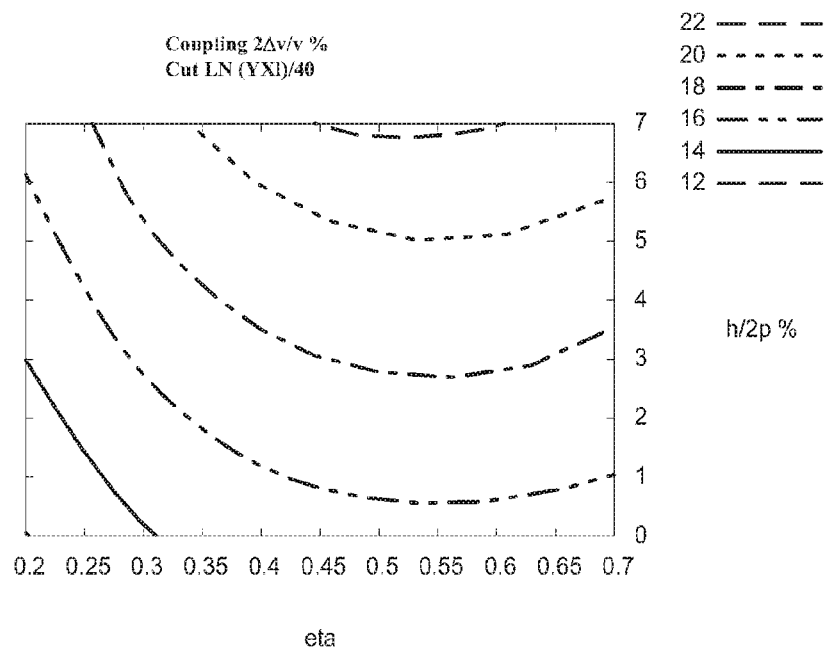
FIG. 11 shows the coupling as a function of the metallization ratio and the relative metal thickness for a cut angle of 40°.

Furthermore, FIGS. 5, 8, and 11 show the coupling as a function of a metallization ratio η and a relative metal thickness h/2p. Again, FIGS. 5, 8 and 11 refer to different cut angles θ. In particular, the cut angle θ is 20° in FIG. 5, 30° in FIG. 8 and 40° in FIG. 11.

As an example, FIG. 5 is discussed in more detail. Curve C16 describes the values of the metallization ratio η and of the relative metal thickness h/2p that provide a coupling 2Δv/v of 16%. The coupling is defined as discussed above by 2Δv/v=2 $(f_A - f_R)/f_0$. A high coupling is directly linked to a large relative bandwidth. Moreover, curve C18 is related to a coupling of 18%. Further, the curves C20, C22, C24, C26 and C28 describe the values of the metallization ratio η and of the relative metal thickness h/2p that provide a coupling 2αv/v of 20%, 22%, 24%, 26% and respectively 28%.

Figure 14:
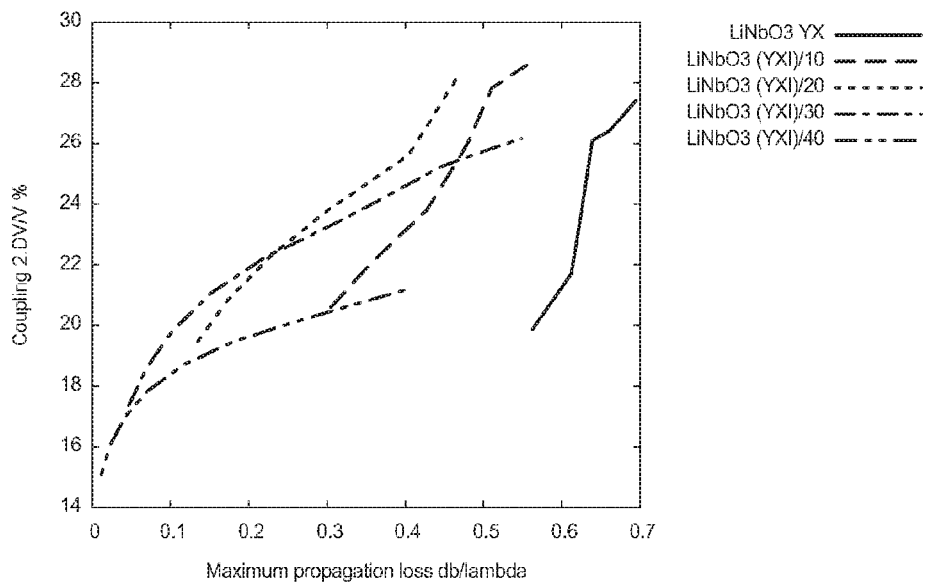
FIG. 14 shows the coupling as a function of the maximum propagation loss for a metallization ratio of 0.4 and for different cut angles.

FIGS. 5, 8 and 14 show that for a given metal thickness, the coupling coefficients are presenting a maximum for a metallization ratio η in the range of 0.5 to 0.55.

Figure 6:
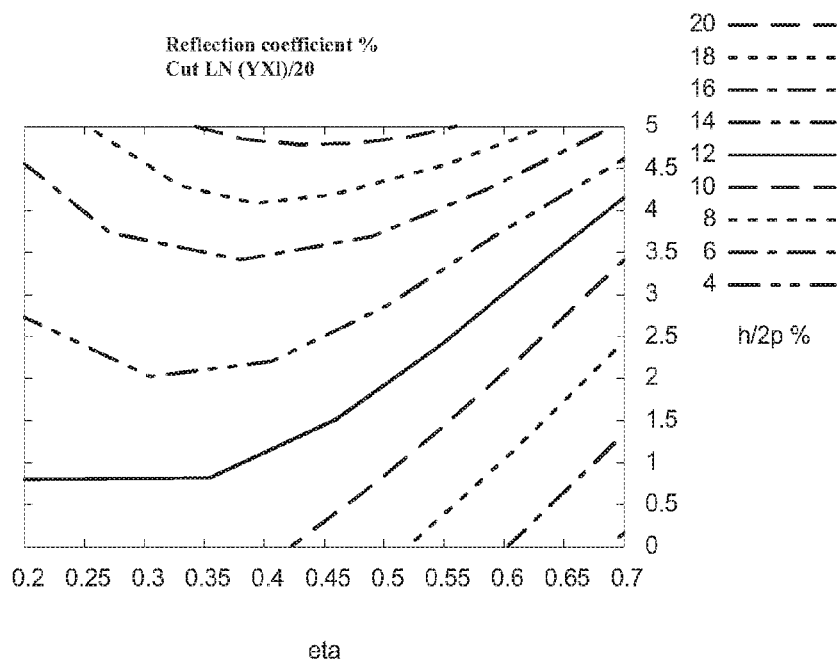
FIG. 6 shows the reflection coefficient as a function of the metallization ratio and the relative metal thickness for a cut angle of 20°.
Figure 9:
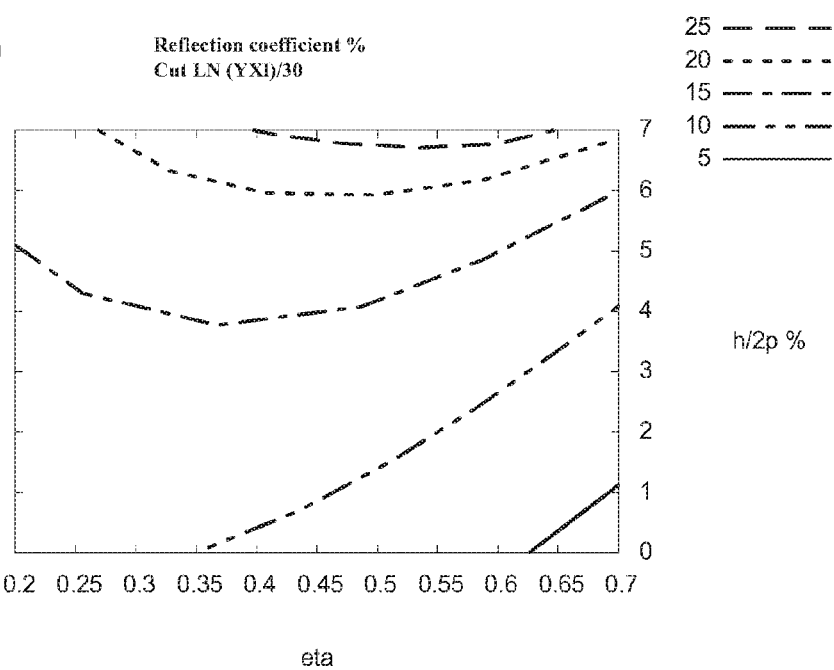
FIG. 9 shows the reflection coefficient per electrode as a function of the metallization ratio and the relative metal thickness for a cut angle of 30°.
Figure 12:
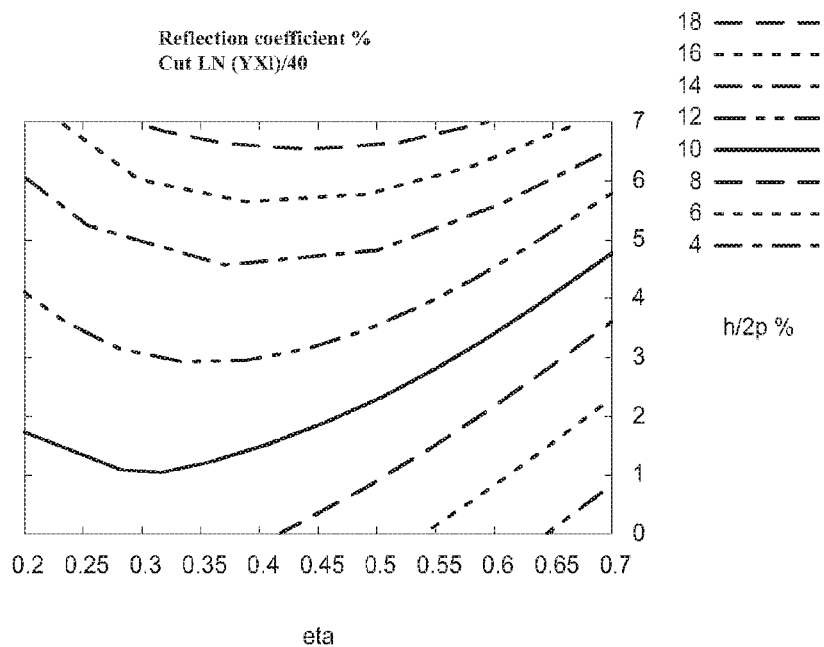
FIG. 12 shows the reflection coefficient as a function of the metallization ratio and the relative metal thickness for a cut angle of 40°.

Further, FIGS. 6, 9 and 12 show the reflection coefficient in percent as a function of a metallization ratio η and a relative metal thickness h/2p. Again, FIGS. 6, 9 and 12 refer to different cut angles θ. In particular, the cut angle θ is 20° in FIG. 6, 30° in FIG. 9, 40° in FIG. 12.

For a given metal thickness, the reflection coefficient is at optimum for a metallization ratio η in the range of 0.3 to 0.55 depending on the metal thickness and the cut angle.

Therefore, a metallization ratio that ranges from 0.3 to 0.55 represents the best compromise between coupling, reflection coefficient and loss.

Figure 13:
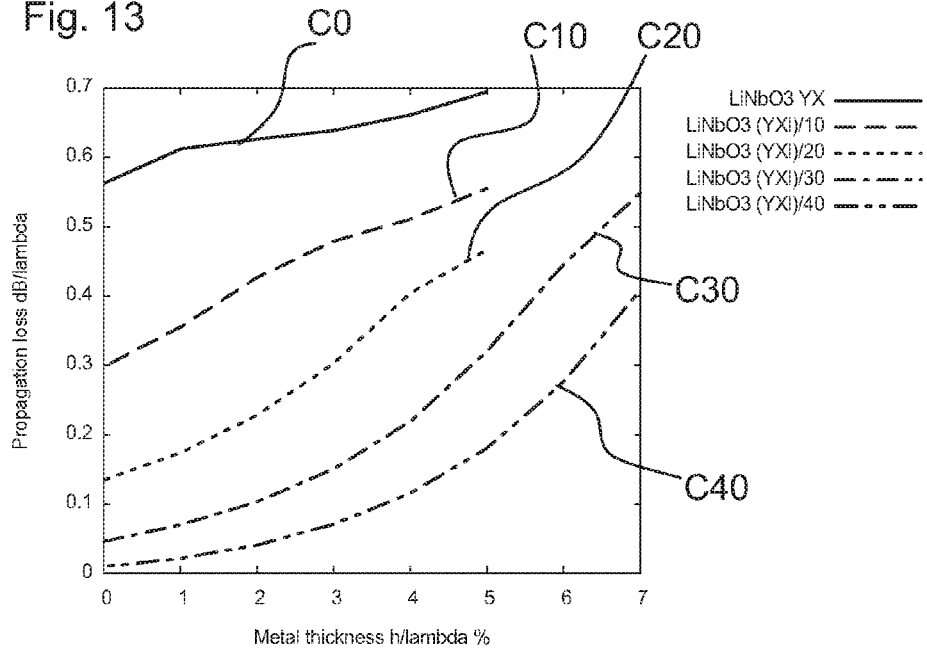
FIG. 13 shows the propagation loss as a function of relative metal thickness for a metallization ratio of 0.4 and for different cut angles.

FIG. 13 shows the maximum propagation loss as a function of the relative metal thickness h/2p. Here, different curves are associated with different cut angles θ. Curve C0 represents a cut angle of 0°. Further, C10 equals a cut angle of 10°, C20 of 20°, C30 of 30°, and C40 of 40°. The metallization ratio η is assumed to be 0.4 in all curves C0-C40. Due to the requirement for a low loss design, a working point with a propagation loss lower than 0.4 dB/λ is selected. Therefore, lithium niobate with a cut angle of 0° is not suited for this requirement.

It can further be gathered from FIG. 13 that for a given maximum propagation loss of 0.4 dB/λ the maximum allowed relative metal thickness depends on the cut angle. For a cut angle of 10°, the maximum relative metal thickness can be about 2%. Further, for a cut angle of 20°, the maximum relative metal thickness can be chosen to be 4%. Moreover, for an angle of 30°, a maximum relative metal thickness of 5.5% can be chosen. For an angle of 40°, a maximum relative metal thickness of 7% can be chosen. The inventors have found that the maximum relative metal thickness $h_{max}/2p$ can be described as a function of the cut angle θ: $h_{max}/2p \leq (\theta/6° \pm 0.5)*1/100$.

In order to define the optimum tradeoff, the coupling $2\Delta v/v$ is plotted as a function of the maximum propagation loss in FIG. 14. The metallization ratio η is kept equal to 0.4 and the relative metal thickness h/2p is varying according to the curves. A propagation loss higher than 0.4 dB/λ should be disregarded corresponding to the limit in the metal thickness discussed previously.

Figure 15:
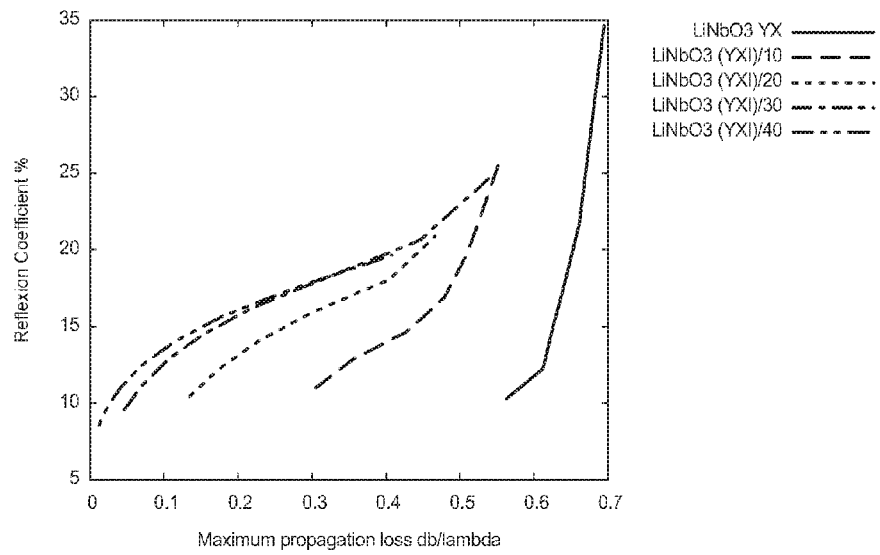
FIG. 15 shows the reflection coefficient as a function of the maximum propagation loss for a metallization ratio of 0.4 and for different cut angles.

Similarly, the reflection coefficient is represented as a function of the propagation loss in FIG. 15.

From these two figures, an optimum cut angle can be deduced. The optimum cut angle ranges from 20° to 40°, allowing to maximize the coupling coefficient and the reflection coefficient while keeping the losses at a minimum level.

Figure 16:
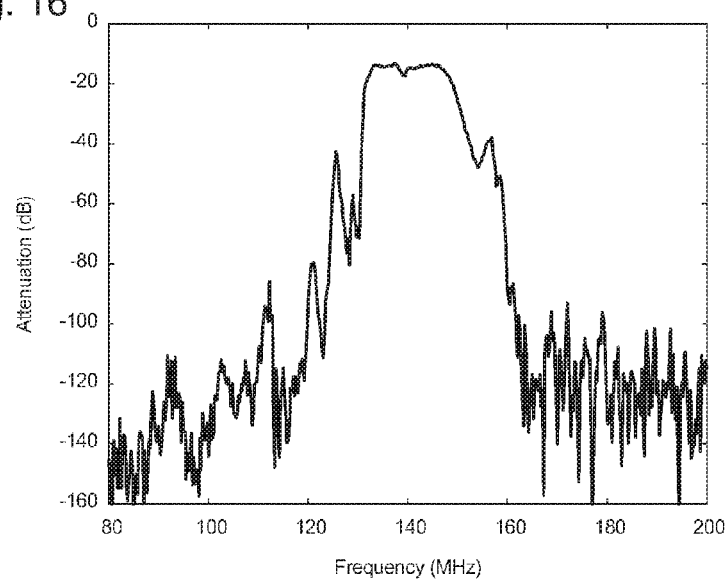
FIG. 16 shows the frequency characteristic of an example filter with a cut angle of 15° which is not covered by the present invention.

FIG. 16 shows the attenuation of a filter realized on a lithium niobate substrate with a cut angle of 15° measured on an impedance of 50Ω without matching network. It should be noted that this filter does not comply with the present invention. The minimum insertion loss is −5.7 dB and bandwidth measured at −3 dB for a minimum loss is 17.3 MHz. The relative bandwidth is 12.4%.

Figure 17:
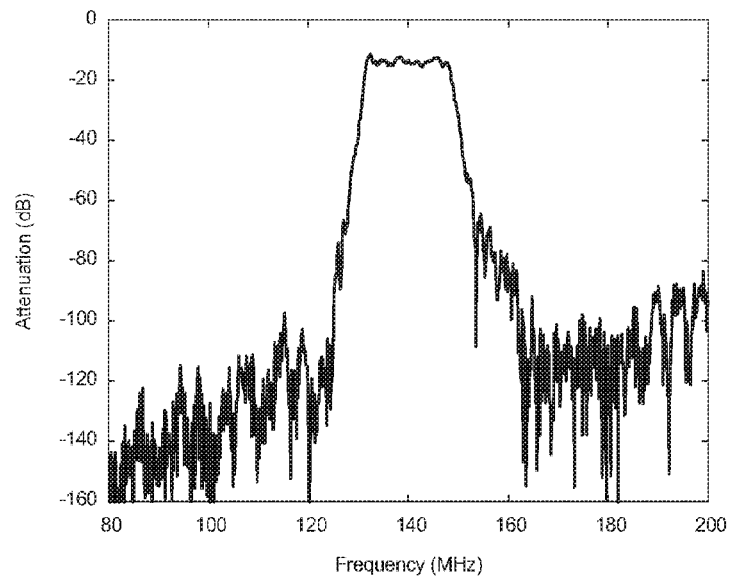
FIG. 17 shows the frequency characteristic of a filter according to the present invention.

In contrast to this, FIG. 17 shows the attenuation of a filter realized according to the present invention. Here, the minimum insertion loss is −5 dB and the bandwidth measured at −3 dB for a minimum loss is 17.3 MHz. The relative bandwidth is 12.4%.

A comparison of the two designs shows that the two main parameters have been improved by the embodiments using the present invention. The minimum insertion loss has been reduced by 0.7 dB because of a lower propagation loss and increased metal thickness which reduces resistive losses in the electrodes. Selectivity and steepness of the transition from passband to rejection are significantly improved. The present invention allows the reflection coefficient to be increased while keeping a sufficient coupling coefficient to achieve the desired passband.

Figure 18:
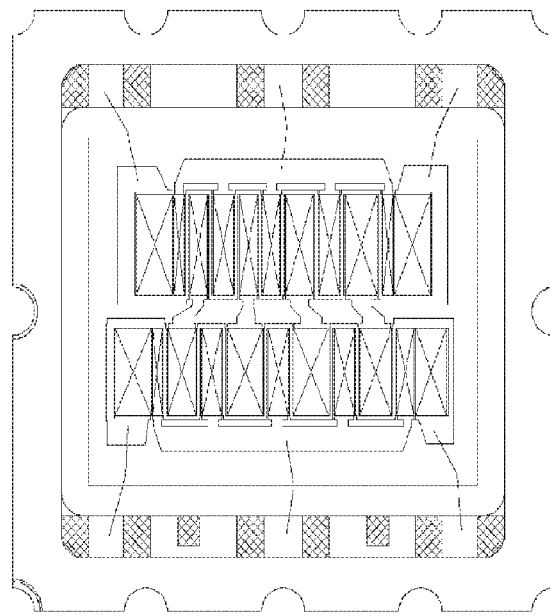
FIG. 18 shows the layout of an SAW filter according to the present invention.

FIG. 18 is a representation of the layout and packaging of an SAW filter according to the present invention. In this example, the design is composed of two acoustic tracks arranged in a cascade to improve the out-of-band attenuation. Each track is composed of multiple IDT with acoustic cavities in-between them. The cavities are filled by metalized stripes which are not part of an IDT. Therefore, the surface wave cannot enter deeper into the substrate. A metallic stripe can be replaced by an electrode to further improve the design. The metallic stripes are connected to ground.

We claim:

1. A surface acoustic wave (SAW) filter comprising:
   a θ-rotated Y-cut X-propagation lithium niobate substrate, wherein a cut angle (θ) ranges from 20° to 40°; and
   an interdigital transducer configured to excite a surface acoustic wave that is formed on the substrate, the interdigital transducer being made of films of a metal selected from the group consisting of aluminum and an aluminum alloy, wherein an electrode of the transducer has as a thickness (h) given by $h/\lambda \leq 0.03833$, wherein λ is a wavelength of the surface acoustic wave.

2. The SAW filter according to claim 1 wherein the SAW filter comprises a resonator on the substrate.

3. The SAW filter according to claim 2, wherein the resonator is made of films of a metal selected from the group consisting of aluminum and aluminum alloy.

4. The SAW filter according to claim 1, wherein a metallization ratio (η) ranges from 0.3 to 0.55 when w is a width of electrode fingers of the interdigital transducers and g is a gap width of the electrode fingers and wherein the equation η=w/(g+w) holds true.

5. The SAW filter according to claim 1, wherein the filter comprises two acoustic tracks arranged in a cascade.

6. The SAW filter according to claim 5, wherein each acoustic track is composed of multiple interdigital transducers with acoustic cavities in between different transducers.

7. The SAW filter according to claim 6, wherein the acoustic cavities are filled by metalized stripes that are not part of the transducers.

8. The SAW filter according to claim 6, wherein the acoustic cavities are filled by electrodes belonging to a side IDT, wherein a pitch in the cavities is different from a pitch of a remaining IDT.

9. The SAW filter according to claim 1, wherein the SAW filter is covered by a temperature compensation layer.

10. A SAW filter according to claim 1, wherein cut angles α and γ range from −5° to 5°.

11. The SAW filter according to claim 1, wherein the SAW filter comprises a plurality of interdigital transducers.

12. The SAW filter according to claim 11, wherein the interdigital transducers are acoustically coupled.

* * * * *